(12) United States Patent
Otsuki

(10) Patent No.: US 7,639,513 B2
(45) Date of Patent: Dec. 29, 2009

(54) RADIO FREQUENCY MODULE AND MANUFACTURING METHOD THEREOF

(75) Inventor: Terukazu Otsuki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 471 days.

(21) Appl. No.: 11/225,014

(22) Filed: Sep. 14, 2005

(65) Prior Publication Data

US 2006/0067070 A1    Mar. 30, 2006

(30) Foreign Application Priority Data

Sep. 28, 2004   (JP)   ............................. 2004-280866

(51) Int. Cl.
*H05K 9/00*   (2006.01)
(52) U.S. Cl. .................. 361/818; 361/760; 361/816
(58) Field of Classification Search .................. 361/816, 361/818, 800; 174/35 R, 51
See application file for complete search history.

(56) References Cited

U.S. PATENT DOCUMENTS

| | | | | |
|---|---|---|---|---|
| 4,412,272 A * | 10/1983 | Wedertz et al. | ............. | 361/692 |
| 5,406,027 A * | 4/1995 | Matsumoto et al. | ......... | 174/546 |
| 5,925,298 A * | 7/1999 | Walles et al. | ................ | 264/139 |
| 6,118,072 A * | 9/2000 | Scott | ........................... | 174/525 |
| 6,208,521 B1 * | 3/2001 | Nakatsuka | .................. | 361/749 |
| 6,449,159 B1 * | 9/2002 | Haba | ........................... | 361/707 |
| 6,469,903 B1 * | 10/2002 | Kondo | ......................... | 361/749 |
| 6,501,661 B1 * | 12/2002 | Moore et al. | ................. | 361/752 |
| 6,711,024 B1 * | 3/2004 | Johansson et al. | ........... | 361/760 |
| 6,927,344 B1 * | 8/2005 | Gall et al. | .................... | 174/254 |
| RE39,628 E * | 5/2007 | Isaak | ........................... | 257/686 |
| 7,246,431 B2 * | 7/2007 | Bang et al. | ..................... | 29/835 |
| 2001/0040793 A1 * | 11/2001 | Inaba | ......................... | 361/749 |
| 2006/0278962 A1 * | 12/2006 | Gibson | ....................... | 257/668 |

FOREIGN PATENT DOCUMENTS

| | | |
|---|---|---|
| JP | 58-48499 | 3/1983 |
| JP | 04-208588 | 7/1992 |
| JP | 05-1294 | 1/1993 |
| JP | 6-232585 A | 8/1994 |
| JP | 6-268385 | 9/1994 |

* cited by examiner

*Primary Examiner*—Hung S Bui
(74) *Attorney, Agent, or Firm*—Nixon & Vanderhye P.C.

(57) ABSTRACT

An enclosure is formed by folding an FPC board having, on the top face thereof, electronic components and, on the back face thereof, a ground conductor pattern in such a way that the electronic components mounted thereon are housed inside the enclosure. The electronic components housed inside the enclosure are covered with the ground conductor pattern. This means that the enclosure serves as a shield enclosure that electromagnetically shields at least part of the electronic components from the outside. In this way, the shield enclosure is formed by folding the FPC board. This makes it possible to realize an electromagnetic shield structure without using an extra shield case as used in the conventional modules.

30 Claims, 11 Drawing Sheets

RADIO FREQUENCY MODULE AND MANUFACTURING METHOD THEREOF

This nonprovisional application claims priority under 35 U.S.C. §119(a) on Patent Application No. 2004-280866 filed in Japan on Sep. 28, 2004, the entire contents of which are hereby incorporated by reference.

BACKGROUND

1. Field

The described technology relates to a radio frequency module that is incorporated, for example, in an electronic communications device and needs to be electromagnetically shielded from the outside, and to a method manufacturing such a radio frequency module.

2. Description of Related Art

In general, radio frequency (RF) modules incorporated, for example, in portable information terminals are so configured that the circuit portions thereof are shielded with a ground case (shield case) such as a metal case made of an electrically conductive material to reduce the harmful effect of unwanted radiation on their peripheral circuits and to reduce the harmful effect of unwanted radiation coming from outside.

FIG. 18 is an exploded perspective view showing a typical example of the configuration of a conventional module employing a shield structure. In this module, a circuit board 101 is inserted in a metal frame 102 made of tin, for example, and a ground pattern of the circuit board 101 is electrically connected to the metal frame 102 by soldering or the like. Then, the top and bottom openings of the metal frame 102 are covered with metal covers 103 and 104, respectively. This makes the circuit board 101 confined inside the metal shield case.

In this case, the circuit board 101 accommodated in the metal frame 102 is electrically connected to the outside with a connector 105 provided on the circuit board 101 via a connector opening 106 formed in the metal frame 102. Alternatively, the circuit board 101 may be electrically connected to the outside via a connector 107 fixed on the metal frame 102.

The space inside the shield case may be divided into a plurality of shield blocks by, for example, providing metal separation walls 108 inside the metal frame 102 of the shield case. This prevents a specific circuit block laid inside the module from affecting the other circuit blocks laid inside the module and vice versa.

FIG. 19 is an exploded perspective view showing an example of the configuration of another conventional module, and FIG. 20 is a perspective view of the module as seen from the back side thereof. This module needs to be made smaller, and thus the top face of a printed circuit board 201 on which electronic components are mounted is directly covered with an electrically conductive case 202 made of metal such as tin or nickel silver. On the other hand, in the most part of the back face of the printed circuit board 201, a ground conductor pattern 203 is formed that serves as electrical shielding from the outside. Part of the electrically conductive case 202 is electrically connected to the ground conductor pattern 203 by soldering or the like.

As shown in FIG. 20, the circuits of the printed circuit board 201 are electrically connected to the outside via edge through holes 204 formed in the printed circuit board 201 in the regions where the ground conductor pattern 203 on the back face of the printed circuit board 201 is partially removed. Alternatively, the circuits of the printed circuit board 201 may be electrically connected to the outside via lands 205 connected to the top face side (the side where the electronic components are mounted) of the printed circuit board 201 or to the inner circuits of the multilayer circuit board. In many small modules, these lands 205 are directly soldered to the mother board. This makes the printed circuit board 201 electrically connected to the outside, and at the same time makes the module fixed to the mother board.

Still another example of the module employing a shield case is disclosed, for example, in Japanese Laid-Open Patent Application No. H6-268385. In this module, a flexible printed circuit board is accommodated in a case so as to line at least two adjacent inner surfaces of the case. This helps increase the density of the electronic components mounted on the flexible printed circuit board.

However, the conventional modules configured as described above require a shield case that electromagnetically shields the circuit portions from the outside, and thus have the following disadvantages.

In the manufacturing process of modules, after various electronic components are mounted on and soldered to the printed circuit board by an automatic component mounting apparatus, it is necessary to mount and fix a shield case thereon by performing partial soldering or re-reflowing. In that case, when partial soldering is visually performed, there is a danger, for example, that a mistake is made during soldering. Moreover, when all the manufacturing processes described above are automated, it is necessary to use a robot apparatus intended exclusively for applying solder and heat to a specific part. This requires a large sum of investment. On the other hand, when a re-reflowing process is performed, all the components pass through a reflow furnace again. This reduces reliability of the surface-mounted components.

Even when re-reflow soldering is performed, just as with partial soldering, there is a possibility that a mistake is made during soldering. Furthermore, both partial soldering and re-reflow soldering often lead to increased manufacturing cost.

Moreover, the shield case needs to be so designed that allowance is made for the size thereof to avoid interference with the components mounted on the printed circuit board. This often makes it difficult, in particular, to reduce the thickness of the module and thus hinders the realization of a thin module.

SUMMARY

In view of the conventionally experienced inconveniences and disadvantages described above, it is an object to provide a small and thin radio frequency module provided with highly reliable electronic components that can realize an electromagnetic shield structure without using an extra shield case and thereby reduce manufacturing cost, and to provide a method of manufacturing such a radio frequency module.

To achieve the above object, a radio frequency module is provided with electronic components mounted on the top face of a flexible printed circuit board, and a shield enclosure that (electromagnetically) shields at least part of the electronic components from the outside. The shield enclosure is formed by folding the flexible printed circuit board in such a way that the electronic components mounted thereon are housed inside the shield structure.

With this configuration, the shield enclosure is formed by folding the flexible printed circuit board in such a way that the electronic components mounted thereon are housed inside the shield enclosure. At this time, when the flexible printed circuit board is folded in such a way that all the electronic components are housed inside the shield enclosure, all the electronic components are electromagnetically shielded from the outside. On the other hand, when the flexible printed circuit board is folded in such a way that part of the electronic components are housed inside the shield enclosure, the housed electronic components alone are electromagnetically shielded from the outside.

In this way, the shield enclosure is formed by folding the flexible printed circuit board. This makes it possible to realize an electromagnetic shield structure without using an extra shield case as used in the conventional modules. Thus, there is no necessity to use a shield case. This eliminates the need to perform the conventional manufacturing processes such as a soldering process and a reflow process. This makes it possible to reduce manufacturing cost and avoid degradation in reliability of the electronic components. Moreover, the absence of the shield case makes it possible to make the radio frequency module smaller and thinner.

It is preferable that a ground conductor pattern is formed on part of the back face of the flexible printed circuit board. In that case, when the flexible printed circuit board is folded in such a way that the electronic components mounted thereon are housed inside the shield enclosure, the electronic components mounted on the top face of the flexible printed circuit board are covered with the ground conductor pattern formed on the back face thereof. This makes it possible to realize a shield enclosure without fail that electromagnetically shields the electronic components from the outside.

Moreover, it is preferable that external signal input/output terminals are formed in a region of the back face of the flexible printed circuit board where no ground conductor pattern is formed, and the external signal input/output terminals are formed over two or more faces of the shield enclosure.

With this configuration, when one (e.g., a bottom face) of the two faces of the shield enclosure over which the terminals are formed is brought into contact with the mother board and then soldered thereto, it is possible to form solder fillets between the terminals formed on the other face (e.g., a side face) of the shield enclosure and the mother board. This gives an improved fixing strength between the shield enclosure and the mother board, and makes it possible to easily carry out inspections of a soldering state of the shield enclosure after it is mounted on the mother board.

Moreover, it is preferable that a folding state of the flexible printed circuit board is fixed with a resin. Using a resin makes the assembly (fabrication) of the shield enclosure easy.

Moreover, it is preferable that the shield enclosure is filled with the resin. In that case, there is no necessity to provide, on the outside of the shield enclosure, a region to which a resin material is applied. This makes it possible to make the module smaller with ease.

Moreover, at least part of the flexible printed circuit board may be a multilayer circuit board. With this configuration, it is possible to realize a modular structure having circuit wiring laid inside the shield enclosure itself. This makes it possible to house a higher performance circuit in a smaller module.

Moreover, the flexible printed circuit board may be composed of a multilayer circuit board and a circuit board that is connected to the multilayer circuit board and has a smaller number of layers than that of the multilayer circuit board. In that case, the circuit board that is connected to the multilayer circuit board and has a smaller number of layers than that of the multilayer circuit board is made easier to bend toward the multilayer circuit board. This makes it possible to easily form the shield enclosure.

Moreover, it is preferable that, when the electronic components are disposed on two mutually facing inner wall surfaces of the shield enclosure, higher profile electronic components face lower profile electronic components between the two mutually facing inner wall surfaces. With this configuration, it is possible to make the thickness of the module in the facing direction as thin as possible. This makes it possible to easily make the module as a whole smaller.

Preferably, the electronic components include an LSI chip, and the external signal input/output terminals are arranged in a matrix on the back face of the flexible printed circuit board. With this configuration, it is possible to easily realize a BGA structure, and realize a module that offers higher density and higher performance.

Moreover, the radio frequency module of the invention may be further provided with a first exposed region that is a region protruding from the shield enclosure where part of the flexible printed circuit board constituting the shield enclosure is exposed. With this configuration, it is possible to form, on the first exposed region, the electronic components that are not required to be shielded from the outside and are preferably shielded from the electronic components (the circuit block) mounted inside the shield enclosure. This makes it possible to assemble these electronic components into a single module.

Preferably, there is formed, at least part of the back face of the flexible printed circuit board constituting the first exposed region, a region where no ground conductor pattern is formed, and an antenna element is formed on the top face of the flexible printed circuit board constituting the first exposed region and having no ground conductor pattern on the back face thereof. With this configuration, it is possible to form a module incorporating an antenna element such a wireless circuit.

At this time, it is preferable that the antenna element is formed by printing a conductor pattern on the top face of the flexible printed circuit board. In that case, it is possible to realize at lower cost a radio frequency module that is compact and has higher mechanical strength.

Moreover, the shield enclosure may include a plurality of sub-enclosures formed by folding a single (common) flexible printed circuit board. In that case, it is possible to separately house, inside the different sub-enclosures, the electronic components that are preferably electromagnetically shielded from each other and from the outside. Thus, with this configuration, even these electronic components can be assembled into a single module.

Moreover, the sub-enclosures may be connected together via a second exposed region where part of the single flexible printed circuit board constituting the sub-enclosures is exposed. In that case, when the length of the second exposed region is appropriately set, it is possible to mount the sub-enclosures with high flexibility. For example, it is possible to mount the sub-enclosures on the mother board at different locations apart from each other, and mount them on the different mother boards.

A method of manufacturing a radio frequency module is provided with: mounting electronic components on (the top face of) a single sheet circuit board having a plurality of enclosures still in a state of developed flat and tied together, each enclosure formed of a flexible printed circuit board (having a ground conductor pattern formed on the back face thereof); forming a plurality of shield enclosures that shield at least part of the electronic components from the outside by folding the portions of the sheet circuit board corresponding to the individual enclosures in such a way that the electronic components mounted thereon are housed inside the enclosures and fixing the individual enclosures; and dividing the sheet circuit board into individual modules each having at least one shield enclosure.

With this configuration, a plurality of shield enclosures are formed by folding the portions of a single sheet circuit board corresponding to the individual enclosures in such a way that the electronic components mounted thereon are housed inside the enclosures and fixing the individual enclosures. Then, the sheet circuit board is divided into individual modules. In this way, it is possible to obtain a plurality of modules each having at least one shield enclosure.

In this way, the electronic components of a plurality of modules are mounted all together on a single sheet circuit board. This makes it possible to obtain a plurality of modules from a single sheet circuit board at the same time. This makes it possible to effectively manufacture the modules and thereby keep manufacturing cost lower.

Moreover, the shield enclosure is formed by folding the flexible printed circuit board. This makes it possible to realize an electromagnetic shield structure without using an extra shield case used in the conventional modules. Thus, there is no necessity to use a shield case. This eliminates the need to perform the conventional manufacturing processes such as a soldering process and a reflow process. This makes it possible to reduce manufacturing cost and avoid degradation in reliability of the electronic components. Moreover, the absence of the shield case makes it possible to make the radio frequency module smaller and thinner.

Moreover, it is preferable that a plurality of shield enclosures are formed by applying a resin to the top face of the sheet circuit board on which the electronic components are mounted, and then, after the sheet circuit board is folded and temporarily fixed with a temporary fixing jig, hardening the resin. This eliminates the need to perform, for example, soldering for the individual modules. This makes the assembly of the shield enclosure easy.

As described above, the shield enclosure is formed by folding the flexible printed circuit board. This makes it possible to realize an electromagnetic shield without using an extra shield case as used in the conventional modules. This makes it possible to easily realize a smaller and thinner module that is manufactured at lower cost and has highly reliable electronic components.

BRIEF DESCRIPTION OF THE DRAWINGS

This and other objects and features of the described technology will become clear from the following description, taken in conjunction with the preferred embodiments with reference to the accompanying drawings in which.

DETAILED DESCRIPTION OF PREFERRED EMBODIMENTS

First Embodiment

Hereinafter, an embodiment of the present invention will be described with reference to the accompanying drawings.

Figure 1:
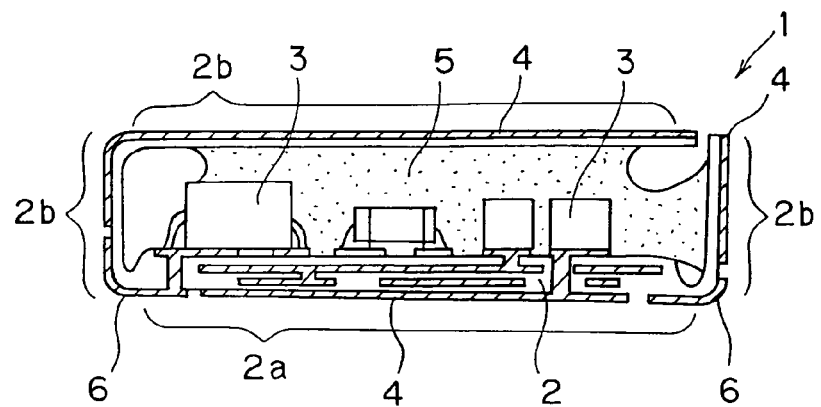
FIG. 1 is a sectional view showing the detailed internal configuration of a non-limiting example radio frequency module, taken along line A-A' shown in FIG. 2 and viewed in the direction indicated by arrows.
Figure 2:
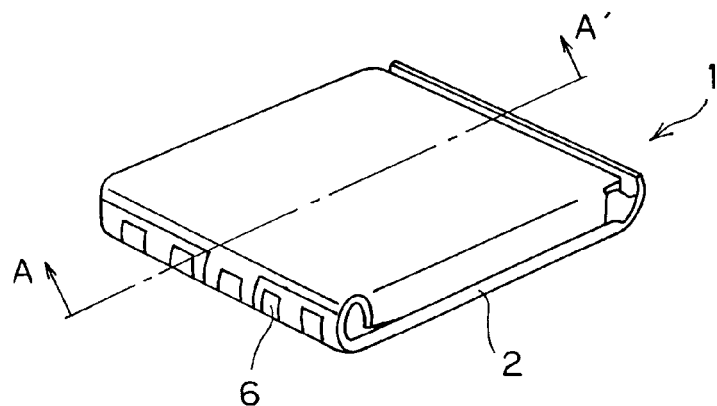
FIG. 2 is a perspective view showing the appearance of the radio frequency module.

FIG. 2 is a perspective view showing the appearance of an example radio frequency module (e.g., a wireless communications card unit), and FIG. 1 is a sectional view showing the detailed internal configuration of the radio frequency module, taken along line A-A' shown in FIG. 2 and viewed in the direction indicated by arrows.

The radio frequency module of this embodiment has an enclosure 1. This enclosure 1 is formed by folding a flexible printed circuit board 2 (hereinafter referred to as an FPC board) having at least a single-layered wiring (circuit) pattern into the shape of a cylinder or a box. In this embodiment, the enclosure 1 has substantially the shape of a rectangular paralleled.

The FPC board 2 includes a multilayer circuit board 2a and a single-layer circuit board 2b that is connected to the multilayer circuit board 2a and has a smaller number of layers than that of the multilayer circuit board 2a. The multilayer circuit board 2a is a circuit board having wiring patterns formed on the top face thereof, on the back face thereof, and in the inner layers sandwiched therebetween. In this embodiment, the multilayer circuit board 2a has, for example, a four-layered structure. Of those four layers, one formed on the board back face side has at least one or both of a ground conductor pattern 4 and a terminal 6, which will be described below. On the other hand, the single-layer circuit board 2*b* is a circuit board having only a single layer of at least one or both of the ground conductor pattern 4 and the terminal 6.

As described above, the multilayer circuit board 2*a* and the single-layer circuit board 2*b* are connected together. This makes the single-layer circuit board 2*b* easier to bend toward the multilayer circuit board 2*a*, and thus makes the fabrication of the enclosure 1 easy. Moreover, it is possible to reduce the risk of, for example, a break in the wiring pattern resulting from the folding process.

Furthermore, at least part of the FPC board 2 is the multilayer circuit board 2*a*. This makes it possible to realize a modular structure having circuit wiring laid inside the enclosure 1. This makes it possible to house a higher performance circuit in a smaller module. Moreover, as shown in FIG. 1, when the enclosure 1 is formed by folding the FPC board 2 in such a way that the multilayer circuit board 2*a* faces the single-layer circuit board 2*b*, it is possible to reduce the thickness of the module as a whole.

On the top face of the FPC board 2, electronic components 3 including an IC (integrated circuit), a capacitor, a resistance element, and a small chip, etc. are mounted. On the other hand, the ground conductor pattern 4 is formed on part of the back face of the FPC board 2. In this embodiment, the enclosure 1 is formed by folding the FPC board 2 in such a way that the electronic components 3 mounted thereon are housed inside the enclosure 1. Thus, the electronic components 3 housed inside the enclosure 1 are covered with the ground conductor pattern 4, and thus electromagnetically shielded from the outside. In view of this, it can be said that the enclosure 1 of this embodiment serves as a shield enclosure that electromagnetically shields the electronic components 3 from the outside. The enclosure 1 is filled with an epoxy resin 5, and a folding state of the FPC board 2 is fixed. This makes it possible to easily form the enclosure 1 without using soldering, for example.

A distinctive feature of the embodiment is that the enclosure 1 serves as a shield enclosure by folding the FPC board 2 in a manner as described above.

External signal input/output terminals 6 (connection lands, electric terminals) are formed in the region of the back face of the FPC board 2 where no ground conductor pattern 4 is formed. In this embodiment, the terminals 6 are formed over two or more faces of the enclosure 1. Specifically, the terminals 6 are disposed along the bent portions of the external walls of the enclosure 1, and formed over two external wall faces of the enclosure 1.

Figure 3:
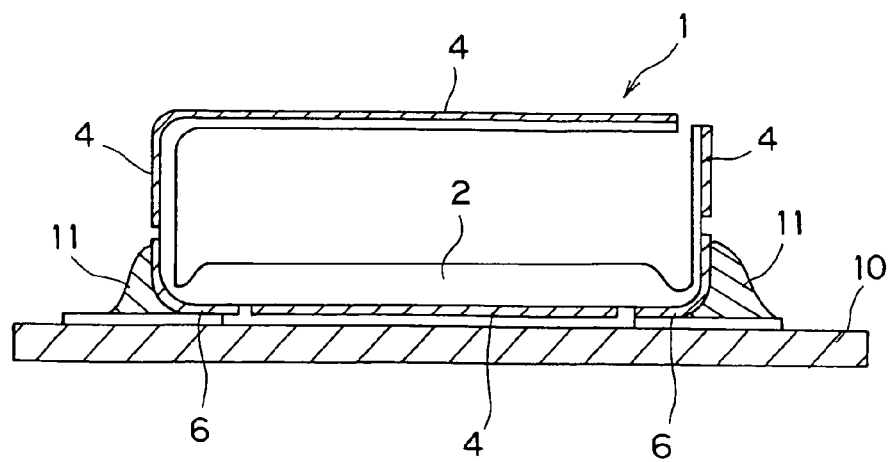
FIG. 3 is a sectional view of the radio frequency module in which one of two faces of an enclosure over which external signal input/output terminals are formed is brought into contact with a mother board and then soldered thereto.

With this configuration, as shown in FIG. 3, when one (e.g., a bottom face) of the two faces of the enclosure 1 over which the terminals 6 are formed is brought into contact with a mother board 10 and then soldered thereto, it is possible to form solder fillets 11 between the terminals 6 formed over the other face (e.g., a side face) of the enclosure 1 and the mother board 10. This gives an improved fixing strength to the module, and makes it possible to easily carry out inspections of a soldering state of the module after it is mounted on the mother board 10 without using a special technique such as X-ray.

Figure 4A:
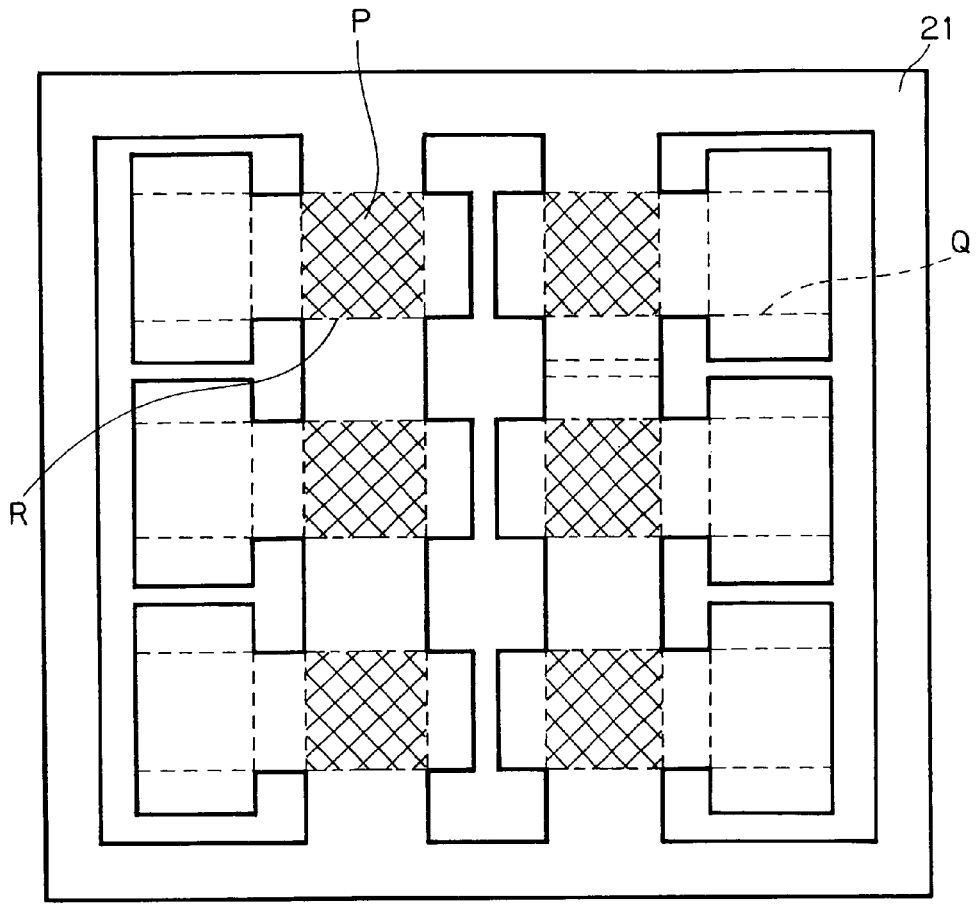
FIG. 4A is a plan view showing a sheet circuit board used for manufacturing the radio frequency module.

Next, the method of manufacturing the radio frequency module of this embodiment will be described. FIG. 4A is a plan view of a sheet circuit board 21 used for manufacturing the radio frequency module. This sheet circuit board 21 is a single circuit board having a plurality of enclosures 1 still in a state of developed flat and tied together, each enclosure formed of the FPC board 2 having, on the back face thereof, the ground conductor pattern 4.

First, the electronic components 3 (see FIG. 4B) are mounted on the sheet circuit board 21. Specifically, the electronic components 3 of a plurality of modules are all together mounted. In FIG. 4A, the electronic components 3 are mounted on cross-hatched areas P of the sheet circuit board 21.

Figure 4B:
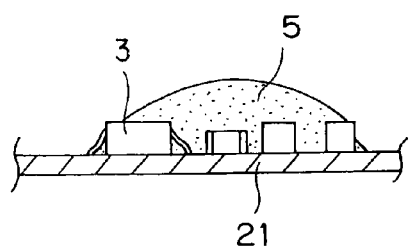
FIG. 4B is a sectional view of the sheet circuit board on which electronic components are mounted.
Figure 4C:
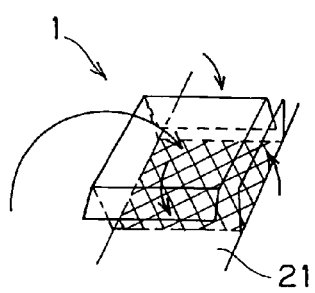
FIG. 4C is a perspective view of an enclosure formed by folding the sheet circuit board.

Next, the portions of the sheet circuit board 21 corresponding to the individual enclosures 1 are folded in such a way that the electronic components 3 mounted thereon are housed inside the enclosures 1, and then fixed. As a result, a plurality of enclosures 1 as shown in FIG. 4C are formed. More specifically, as shown in FIG. 4B, an appropriate amount of epoxy resin 5 is dropped from a dispenser onto the top face of the sheet circuit board 21 on which the electronic components 3 are mounted. Then, as shown in FIG. 4C, the portions of the sheet circuit board 21 corresponding to the individual modules are folded into the shape of a box with a folding jig (not shown), and then, with the folding jig being attached, temporarily fixed with a temporary fixing jig (not shown). Note the sheet circuit board 21 is folded along the broken lines Q shown in FIG. 4A at a right angle in such a way that the face shown in FIG. 4A faces inward.

Then, the sheet circuit board 21 on which the enclosures are temporarily fixed is placed in the oven, and then heated to harden the epoxy resin 5. After the epoxy resin 5 is hardened, the folding jig is removed. Then, the sheet circuit board 21 is cut along the alternate long and short dash lines R shown in FIG. 4A with a cutting jig such as a Thomson die, and thus divided into individual modules having at least one enclosure 1.

As described above, the radio frequency module of this embodiment has the enclosure 1 that serves as a shield enclosure shielding the electronic components 3 from the outside, and the enclosure 1 is formed by folding the FPC board 2 in such a way that the electronic components 3 mounted thereon are housed inside the enclosure 1. In this way, the enclosure 1 is formed by folding the FPC board 2 itself. This makes it possible to easily realize an electromagnetic shield structure without using an extra shield case as used in the conventional modules.

Thus, there is no necessity to use a shield case. This eliminates the need to perform the conventional manufacturing processes such as a soldering process and a reflow process. This makes it possible to reduce manufacturing cost and improve reliability of the electronic components 3. Moreover, the absence of the shield case makes it possible to easily make the radio frequency module smaller and thinner. This means that it is possible to realize an inexpensive radio frequency module suitable for applications that require smaller and thinner portable communications devices.

Furthermore, according to the method of manufacturing the radio frequency module of this embodiment, the electronic components 3 of a plurality of modules are mounted all together on a single sheet circuit board 21. This makes it possible to obtain a plurality of modules from a single sheet circuit board 21 at the same time. This makes it possible to effectively manufacture the modules and thereby keep manufacturing cost lower.

Note that the method of manufacturing the radio frequency module of this embodiment can basically be applied to other embodiments which will be described below.

As shown in FIG. 1, this embodiment deals with a case where all the electronic components 3 mounted on the FPC board 2 are disposed inside the enclosure 1 by folding the FPC board 2, and the enclosure 1 is made to shield all the electronic components 3 from the outside. It should be understood, however, that the enclosure 1 may be made to shield part of the electronic components 3 from the outside. An example of such a configuration is described in a fourth embodiment which will be described further below (see FIG. 10). In view of this, it can be said that the enclosure 1 is a shield enclosure that shields at least part of the electronic components 3 from the outside.

Second Embodiment

Another embodiment will be described below with reference to the accompanying drawings. For the sake of convenience, in the following description, such members as are found also in the first embodiment will be identified with common reference numerals.

Figure 5:
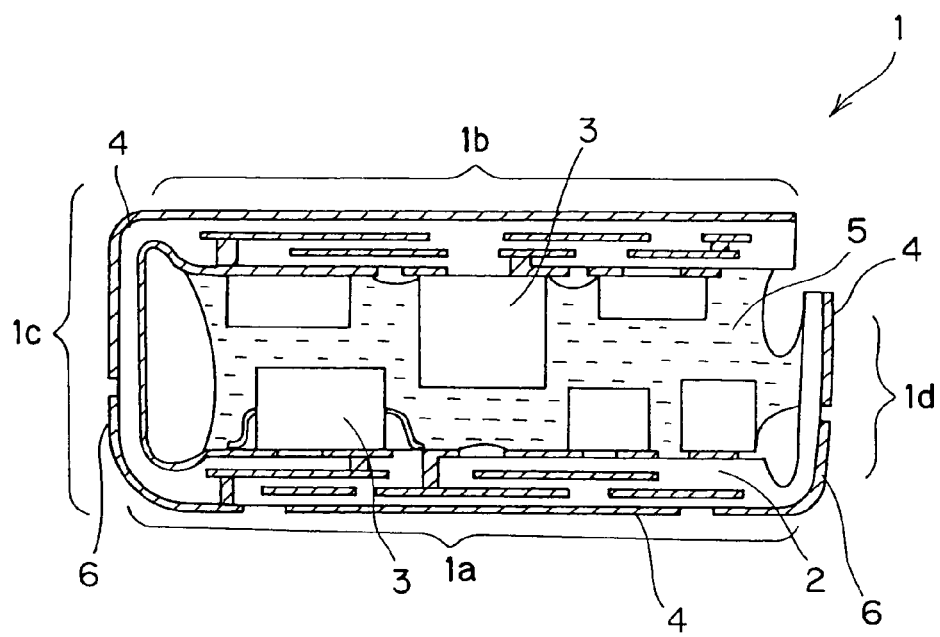
FIG. 5 is a sectional view showing the schematic configuration of a radio frequency module of another embodiment of the invention.

FIG. 5 is a sectional view showing the schematic configuration of a radio frequency module of this embodiment. Here, of the wall portions constituting the enclosure 1 of the radio frequency module, the mutually facing wall portions are indicated by reference numerals 1a and 1b, the wall portion that connects between the edge portions of the wall portions 1a and 1b is indicated by reference numeral 1c, and the wall portion connected to the wall portion 1a and located opposite to the wall portion 1c is indicated by reference numeral 1d.

In this embodiment, the electronic components 3 are mounted on two inner wall surfaces of the mutually facing wall portions 1a and 1b of the enclosure 1. The radio frequency module of this embodiment is thus characterized by having a higher density circuit design, and, in other respects, has the same overall configuration as that of the first embodiment in which the electronic components 3 are mounted only on one inner wall surface of the enclosure 1.

In this embodiment, the electronic components 3 are disposed on the inner wall surfaces of the two mutually facing wall portions 1a and 1b of the enclosure 1. Furthermore, the electronic components 3 are arranged in such a way that higher profile electronic components face lower profile electronic components between the two mutually facing inner wall surfaces, so that tall electronic components 3 are not brought into contact with each other in the facing direction. This makes it possible to make the thickness of the module in the facing direction as thin as possible. Note that this benefit is especially advantageous when high profile electronic components are used as the electronic components 3.

Moreover, in this embodiment, the FPC board 2 constituting the wall portions 1a and 1b has a four-layered structure. Of those four layers, one formed on the back face side has at least one or both of the terminal 6 and the ground conductor pattern 4. On the other hand, the FPC board 2 constituting the wall portion 1c has a two-layered structure. Of those two layers, one formed on the back face side has at least one or both of the terminal 6 and the ground conductor pattern 4, and the other is a layer inside which electric wiring alone is laid to connect between the regions of the two wall portions 1a and 1b where the electronic components 3 are mounted.

As described above, the FPC board 2 constituting the wall portion 1c has a two-layered structure, and the FPC board 2 constituting the wall portions 1a and 1b has a four-layered structure. This makes the former FPC board 2 thinner than the latter FPC board 2, and thus makes the former easier to bend toward the latter.

Third Embodiment

Still another embodiment will be described below with reference to the accompanying drawings. For the sake of convenience, in the following description, such members as are found also in the first and second embodiments will be identified with common reference numerals.

Figure 6:
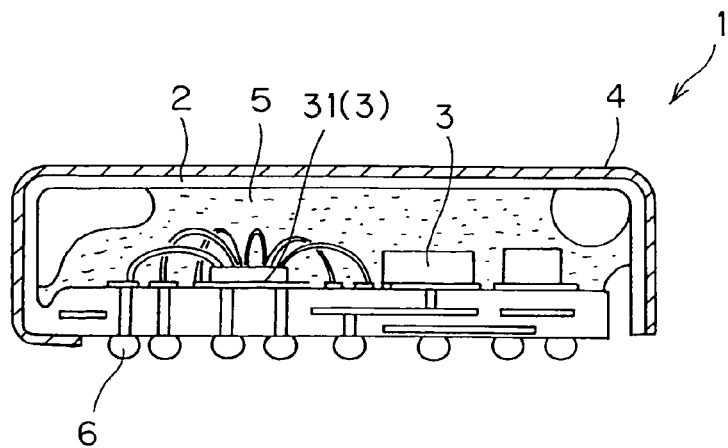
FIG. 6 is a sectional view showing the schematic configuration of a radio frequency module of still another embodiment.
Figure 7:
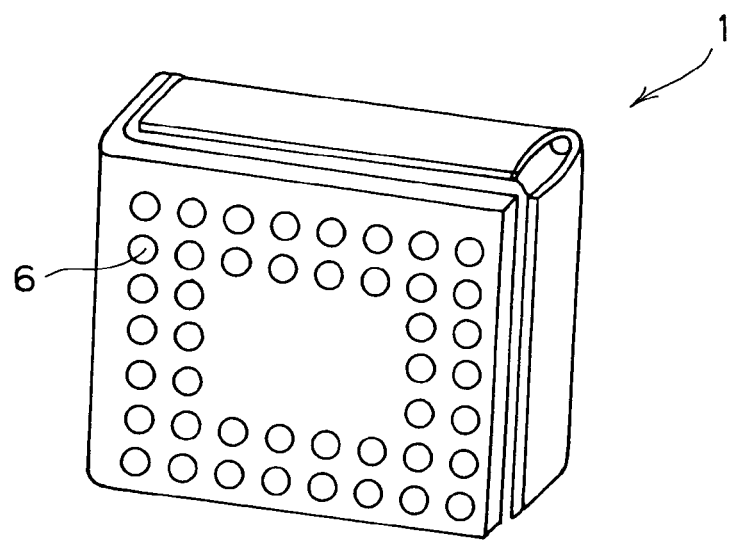
FIG. 7 is a perspective view of the radio frequency module as seen from the back side thereof.

FIG. 6 is a sectional view showing the schematic configuration of a radio frequency module of this embodiment, and FIG. 7 is a perspective view of the radio frequency module as seen from the back side thereof. The radio frequency module of this embodiment has the same overall configuration as that of the first embodiment, and is different therefrom only in that the electronic components 3 include not only chip electronic components such as a normal capacitor and a resistance but also an LSI (large scale integration) chip 31, and the terminals 6 are arranged in a matrix on the back face of the FPC board 2.

The LSI chip 31 is directly bare-chip mounted on the FPC board 2, and is connected to the surrounding connection lands by wire bonding. Furthermore, the terminals 6 have a BGA (Ball Grid Array) structure composed of solder balls for external connections.

As described above, the terminals 6 are arranged in a matrix on the back face of the board. This makes it possible to easily realize a BGA structure. Moreover, the electronic components 3 of the radio frequency module of this embodiment include the LSI chip 31. This makes it possible to realize a radio frequency module that offers higher density and higher performance.

Instead of wire bonding, face-down bonding may be used to connect the LSI chip 31 and FPC board 2. Furthermore, in all the embodiments described above and hereinafter also, the electronic components 3 such as an IC, other than the LSI chip 31, may be bare-chip mounted.

Fourth Embodiment

Still another embodiment will be described below with reference to the accompanying drawings. For the sake of convenience, in the following description, such members as are found also in the first to third embodiments will be identified with common reference numerals.

Figure 8:
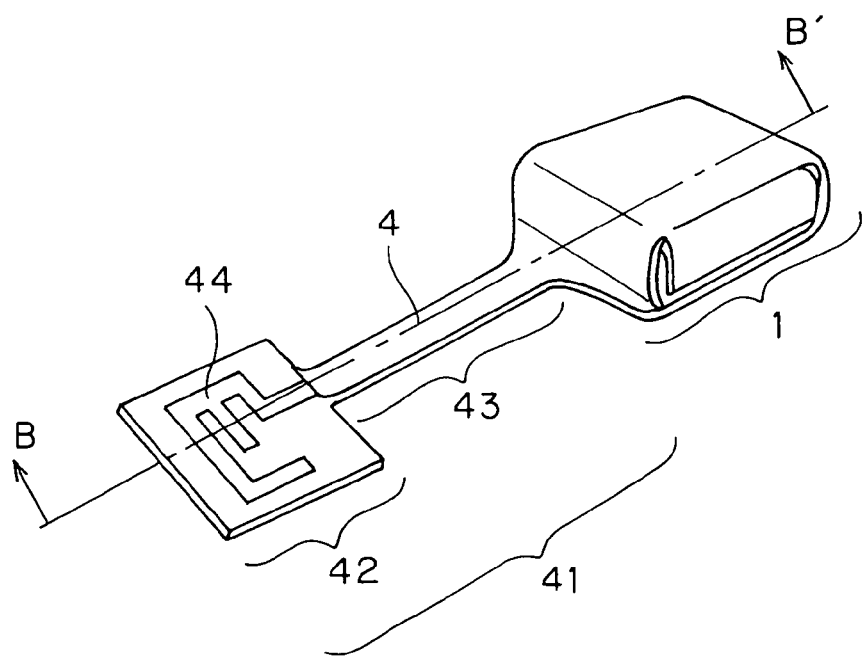
FIG. 8 is a perspective view showing the appearance of a radio frequency module of still another embodiment.
Figure 9:
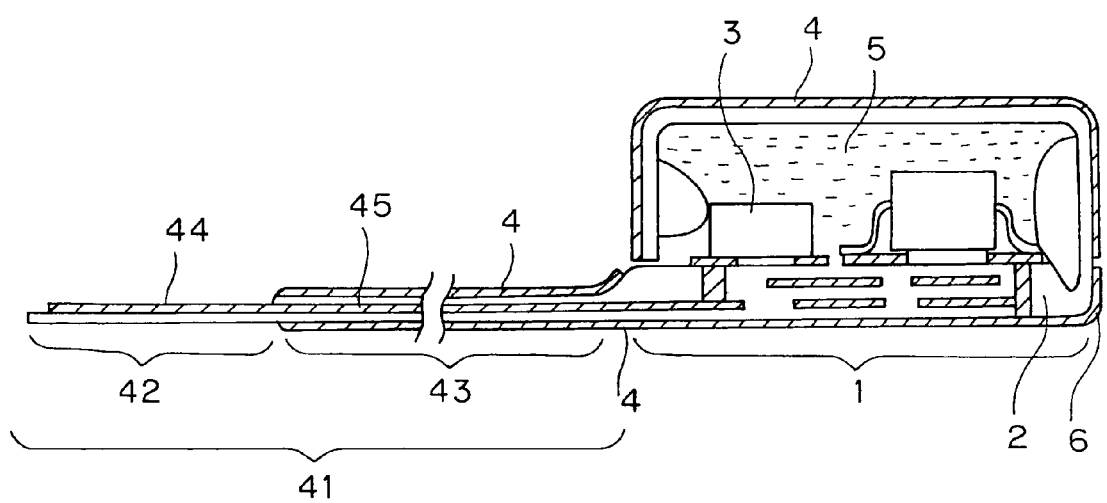
FIG. 9 is a sectional view showing the detailed internal configuration of the radio frequency module, taken along line B-B' shown in FIG. 8 and viewed in the direction indicated by arrows.

FIG. 8 is a perspective view showing the appearance of a radio frequency module of this embodiment, and FIG. 9 is a sectional view showing the detailed internal configuration of the radio frequency module, taken along line B-B' shown in FIG. 8 and viewed in the direction indicated by arrows. The radio frequency module of this embodiment differs from those of the first to third embodiments only in that it has not only the enclosure 1 but also a first exposed region 41.

The first exposed region 41 is a region protruding from the enclosure 1 where part of the FPC board 2 constituting the enclosure 1 is exposed. Considering that the radio frequency module of this embodiment has the first exposed region 41 described above, it can be said that the enclosure 1 of the radio frequency module of this embodiment is formed by folding the FPC board 2 in such a way that part thereof is exposed.

The first exposed region 41 has a tip portion 42 and a lead portion 43. On the top face of the tip portion 42, an antenna element 44 is formed by printing a conductor pattern. On the other hand, on the back face of the tip portion 42, no ground conductor pattern is formed.

The lead portion 43 connects the tip portion 42 and the enclosure 1, and has, on the top and back faces thereof, the ground conductor patterns 4. Between those two-layered ground conductor patterns 4, an antenna signal wire 45 is formed that connects the antenna element 44 of the tip portion 42 and the wiring pattern of the enclosure 1. Specifically, the lead portion 43 has a three-layered structure in which the antenna signal wire 45 is shielded by the two ground conductor patterns 4 from above and from below.

As described above, in the radio frequency module of this embodiment, the ground conductor pattern 4 is formed on part of the back face of the FPC board 2 constituting the first exposed region 41 (the back face of the lead portion 43), and the antenna element 44 is formed on the top face of the tip portion 42 (i.e., the FPC board 2 having no ground conductor pattern 4 on the back face thereof). With this configuration, it is possible to easily realize an RF circuit module for wireless apparatuses incorporating the antenna element 44.

Furthermore, the portion (the tip portion 42) of the first exposed region 41 where the antenna element 44 is formed and the enclosure 1 are connected together with the lead portion 43 formed of the FPC board 2. This helps enhance flexibility in the layout of the antenna element 44 when the radio frequency module is installed in devices, and thus enhance flexibility in the design of the devices in which the radio frequency module is incorporated.

Moreover, the antenna element 44 is formed by printing a conductor pattern on the top face of the tip portion 42 formed of the FPC board 2. This makes it possible to realize at lower cost a radio frequency module that is compact and has higher mechanical strength.

This embodiment deals with a case where the antenna element 44 is a pattern antenna formed by printing a conductor pattern. It should be understood, however, that the antenna element 44 may be composed of a chip antenna element and mounted on the tip portion 42.

Alternatively, it is possible to adopt a configuration in which the lead portion 43 connecting between the tip portion 42 on which the antenna is mounted and the enclosure 1 is omitted so that the antenna element 44 is located immediately adjacent to the enclosure 1. In that case, since the lead portion 43 having the ground conductor pattern 4 on the back face thereof is omitted, the FPC board 2 constituting the first exposed region 41 does not have, over the entire area of the back face thereof, the ground conductor pattern 4.

Thus, the configuration shown in FIGS. 8 and 9 and the configuration in which the lead portion 43 is omitted can be integrated into the following configuration. In the radio frequency module of this embodiment, there is formed, at least part of the back face of the FPC board 2 constituting the first exposed region 41, a region where no ground conductor pattern 4 is formed, and the antenna element 44 is formed on the top face of the FPC board 2 constituting the first exposed region 41 and having no ground conductor pattern 4 on the back face thereof.

Figure 10:
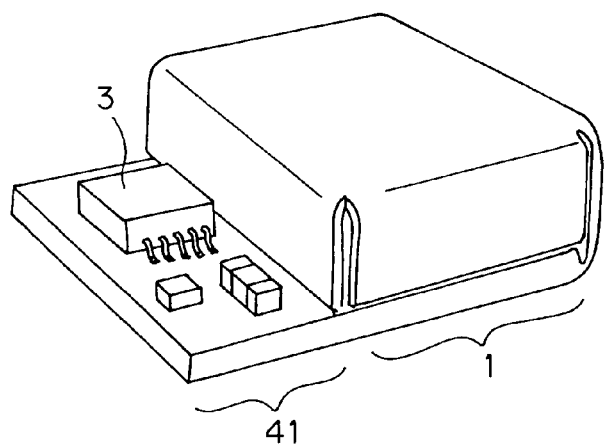
FIG. 10 is a perspective view showing another configuration of the radio frequency module.

Moreover, in the configuration in which the lead portion 43 is omitted so that the first exposed region 41 is directly connected to the enclosure 1, the electronic components 3 other than the antenna and the circuits may be mounted on the first exposed region 41. FIG. 10 is a perspective view showing the appearance of the radio frequency module having the electronic components 3 mounted not only inside the enclosure 1 but also on the first exposed region 41. With this configuration, the electronic components 3 other than the antenna that are not required to be shielded from the outside and are preferably shielded from the electronic components 3 (the circuits block) mounted inside the enclosure 1 are formed on the first exposed region 41. These electronic components 3 can be assembled into a single module. This benefit can be obtained just because the radio frequency module has both the enclosure 1 and the first exposed region 41.

Note that any or any combination of the enclosures 1 described in the first to third embodiments can be applied to the radio frequency module of this embodiment.

Fifth Embodiment

Still another embodiment will be described below with reference to the accompanying drawings. For the sake of convenience, in the following description, such members as are found also in the first to fourth embodiments will be identified with common reference numerals.

Figure 11:
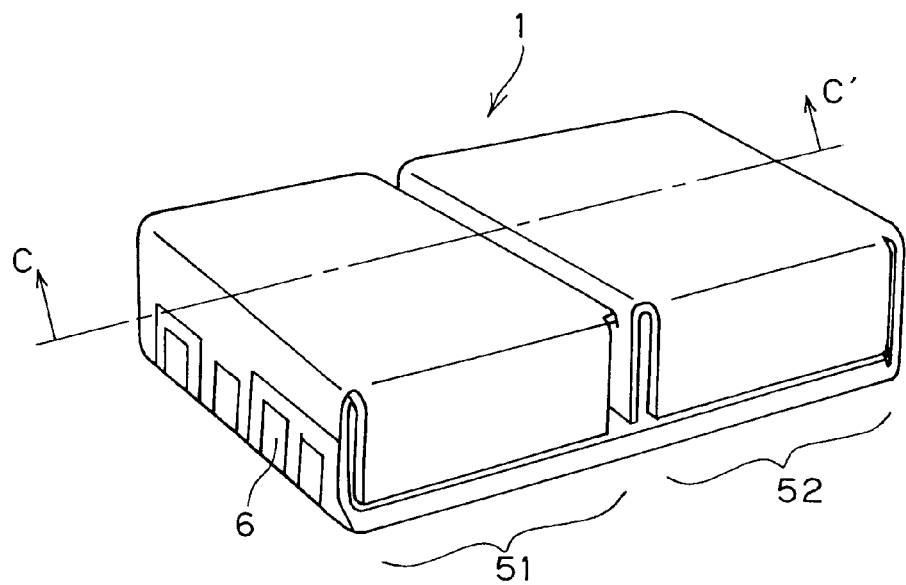
FIG. 11 is a perspective view showing the appearance of a radio frequency module of still another embodiment.
Figure 12:
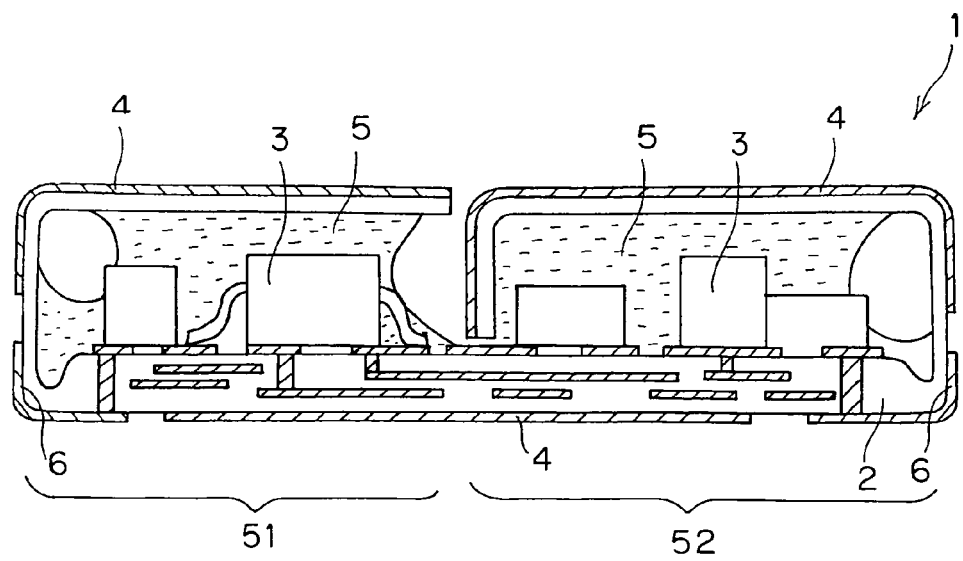
FIG. 12 is a sectional view showing the detailed internal configuration of the radio frequency module, taken along line C-C' shown in FIG. 11 and viewed in the direction indicated by arrows.

FIG. 11 is a perspective view showing the appearance of a radio frequency module of this embodiment, and FIG. 12 is a sectional view showing the detailed internal configuration of the radio frequency module, taken along line C-C' shown in FIG. 11 and viewed in the direction indicated by arrows. In this embodiment, the enclosure 1 of the radio frequency module is so configured as to have a plurality of sub-enclosures 51 and 52 formed by folding a single (common) FPC board 2. The sub-enclosures 51 and 52 are shield enclosures for electromagnetically shielding the electronic components 3 mounted on the FPC 2 from the outside. The sub-enclosures 51 and 52 are formed, for each of the two circuit blocks to be separately shielded, by bending in the shape of a box as in the first embodiment the edge portions of the part of the FPC 2 located opposite the other circuit block.

As described above, the enclosure 1 is so configured as to have the sub-enclosures 51 and 52. With this configuration, it is possible to separately house, inside different sub-enclosures 51 and 52, the electronic components 3 that are preferably electromagnetically shielded from each other and from the outside. Thus, with this configuration, even these electronic components 3 can be assembled into a single module.

Figure 13:
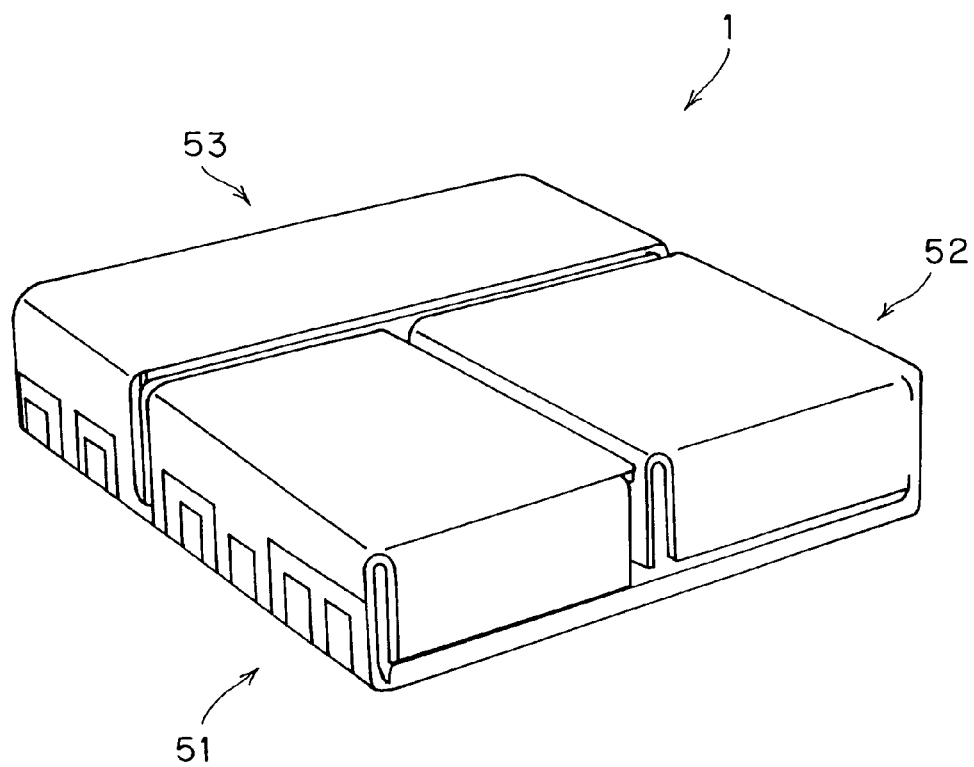
FIG. 13 is a perspective view showing another configuration of the radio frequency module.

This embodiment deals with a case where the enclosure 1 is so configured as to have two sub-enclosures 51 and 52. It is should understood, however, that the number of sub-enclosures is not limited to two. For example, as shown in FIG. 13, the enclosure 1 can be so configured as to have three sub-enclosures 51, 52, and 53 formed by folding a single FPC board 2. Moreover, the enclosure 1 can be so configured as to have four or more sub-enclosures.

Sixth Embodiment

Still another embodiment will be described below with reference to the accompanying drawings. For the sake of convenience, in the following description, such members as are found also in the first to fifth embodiments will be identified with common reference numerals.

Figure 14:
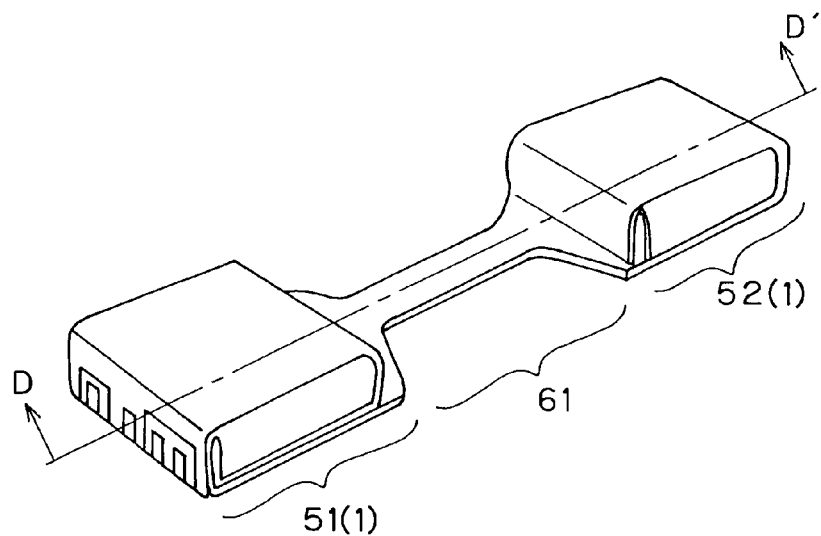
FIG. 14 is a perspective view showing the appearance of a radio frequency module of still another embodiment.
Figure 15:
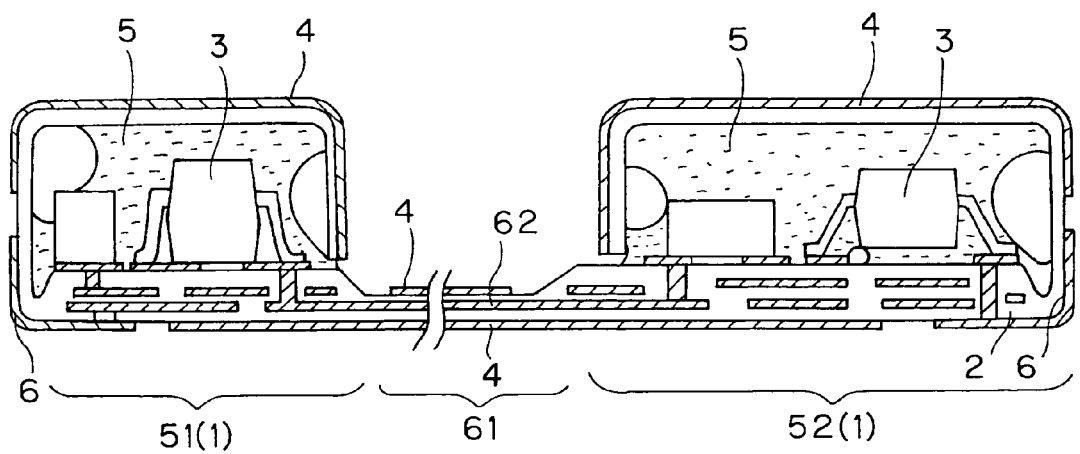
FIG. 15 is a sectional view showing the detailed internal configuration of the radio frequency module, taken along line D-D' shown in FIG. 14 and viewed in the direction indicated by arrows.

FIG. 14 is a perspective view showing the appearance of a radio frequency module of this embodiment, and FIG. 15 is a sectional view showing the detailed internal configuration of the radio frequency module, taken along line D-D' shown in FIG. 14 and viewed in the direction indicated by arrows. The radio frequency module of this embodiment is the same as the radio frequency module of the fifth embodiment in that it is provided with a plurality of sub-enclosures 51 and 52 formed by folding a single FPC board 2, and is different therefrom only in that it is provided with the sub-enclosures 51 and 52 connected together via a second exposed region 61 (a harness portion).

The second exposed region 61 is a region where part of the top face of the single FPC board 2 constituting the sub-enclosures 51 and 52 is exposed. As with the lead portion 43 of the fourth embodiment (see FIGS. 8 and 9), the second exposed region 61 has a three-layered structure in which a signal wire 62 connecting the wiring patterns of the FPC board 2 constituting the sub-enclosures 51 and 52 is sandwiched between the ground conductor patterns 4 from above and from below. With this structure, the signal wire 62 is shielded.

With the configuration of this embodiment, it is possible to obtain the same benefit as that obtained with the configuration described in the fifth embodiment. Specifically, it is possible to separately form, inside the different sub-enclosures 51 and 52, the electronic components 3 (circuit patterns) that need to avoid mutual interference, and assemble them into a single module. In addition to this, it is possible to obtain the following benefit. When the length of the second exposed region 61 is appropriately designed, it is possible to enhance flexibility in the design of the devices in which the module is incorporated. For example, it is possible to mount the sub-enclosures 51 and 52 on the mother board at different locations apart from each other, and mount them on the different mother boards.

Figure 16:
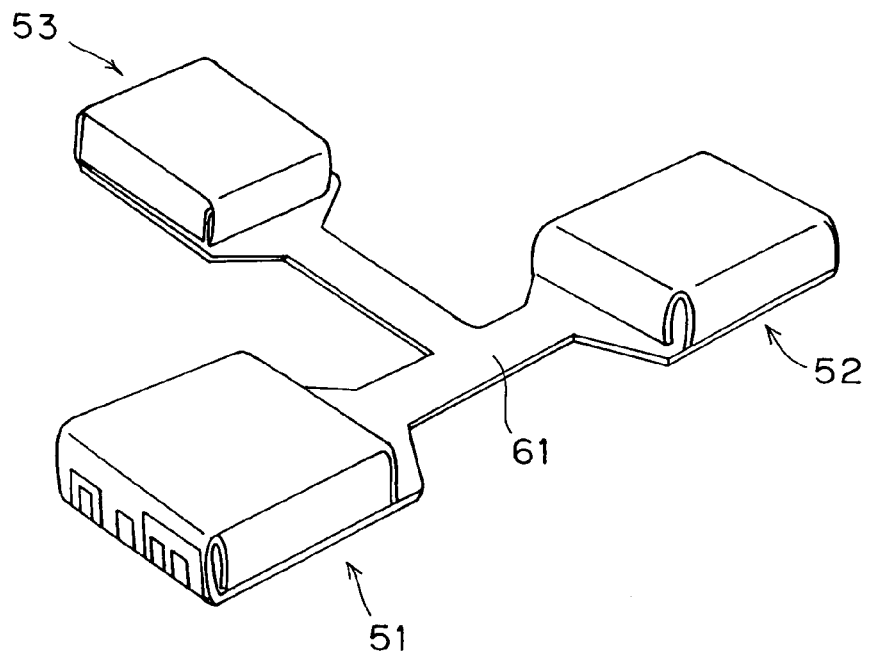
FIG. 16 is a perspective view showing another example of the configuration of the radio frequency module.

This embodiment deals with a case where the two sub-enclosures 51 and 52 are connected together with the second exposed region 61. It should be understood, however, the number of sub-enclosures is not limited to two. For example, as shown in FIG. 16, the enclosure 1 can be composed of three sub-enclosures 51, 52, and 53 formed by folding a single FPC board 2 and connected together with the second exposed region 61 so as to be assembled into a single module. Needless to say, it is also possible to form a single module in which four or more sub-enclosures are connected together with the second exposed region 61.

Figure 17:
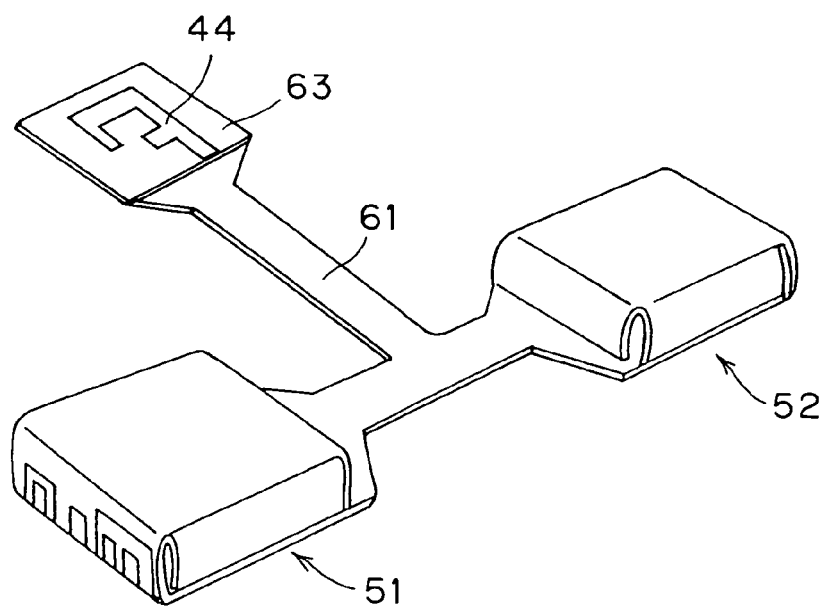
FIG. 17 is a perspective view showing still another example of the configuration of the radio frequency module.
Figure 18:
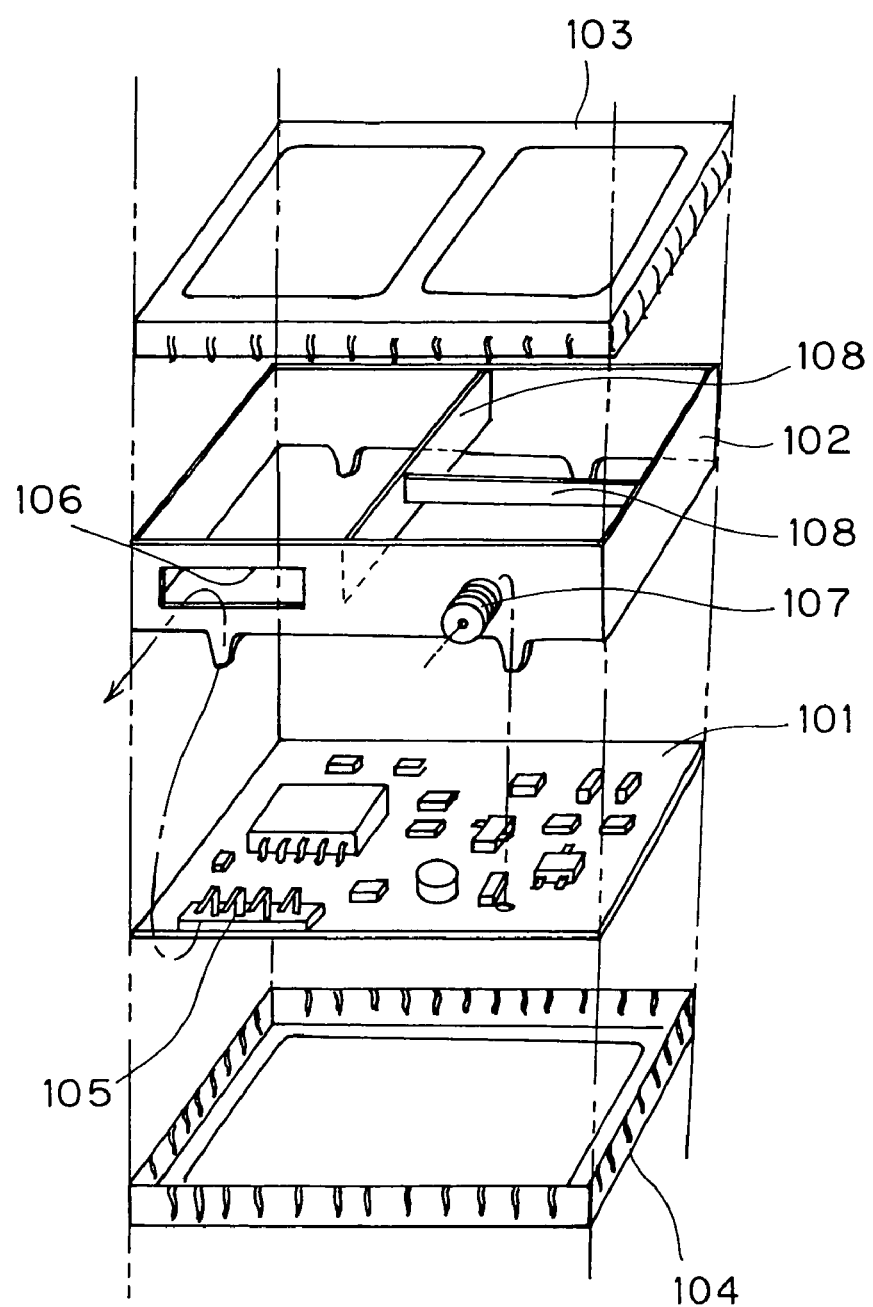
FIG. 18 is an exploded perspective view showing the schematic configuration of a conventional module.
Figure 19:
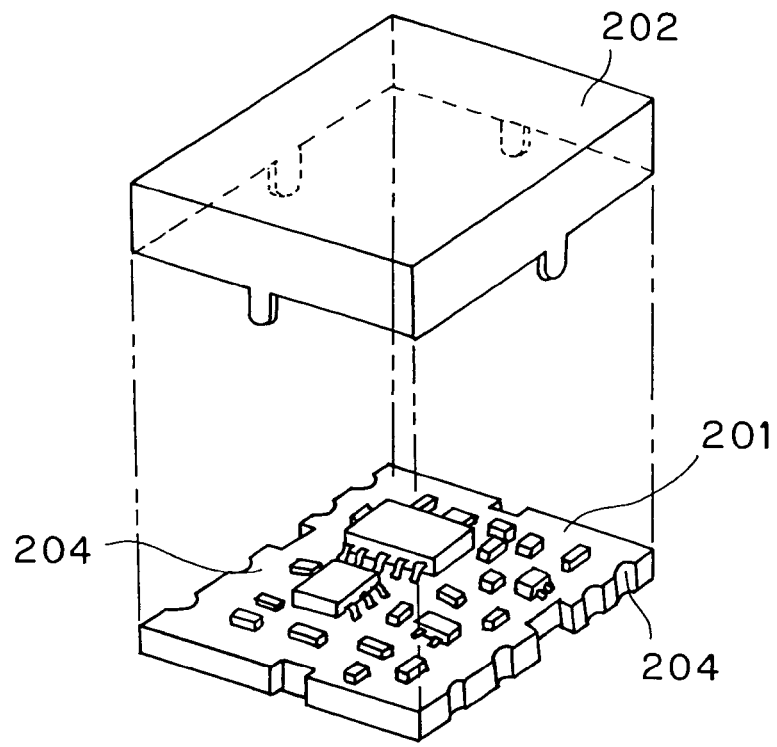
FIG. 19 is an exploded perspective view showing the schematic configuration of anther conventional module.
Figure 20:
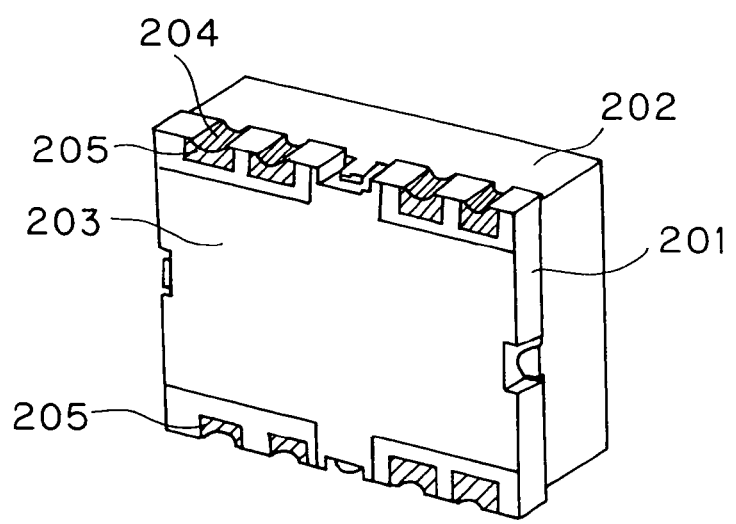
FIG. 20 is a perspective view of the module as seen from the back side thereof.

Furthermore, the antenna element 44 of the fourth embodiment (see FIGS. 8 and 9) can be built into and thereby integrated into the radio frequency module of this embodiment. Specifically, as shown in FIG. 17, it is possible to adopt a configuration in which the sub-enclosures 51 and 52 are connected together with the second exposed region 61, and part of the second exposed region 61 is extended in the direction different from the direction in which the sub-enclosures 51 and 52 are connected, so that, on a tip portion 63 thereof, the antenna element 44 is formed.

Needless to say, other than the configurations described in the embodiments above, it is possible to form a radio frequency module by appropriately combining these configurations. Furthermore, to suit the purpose of the radio frequency module, it is possible to appropriately change the design thereof such as changing the number of layers of the FPC board 2.

The radio frequency module and the manufacturing method thereof described in the embodiments above may be expressed as follows.

The radio frequency module is a radio frequency module formed of a flexible printed circuit board having electronic components mounted on the top face thereof. This radio frequency module has a shield enclosure that is formed by folding the flexible printed circuit board in such a way that the electronic components mounted thereon are housed inside the module so as to (electromagnetically) shield at least part of the electronic components from the outside.

The radio frequency module is a radio frequency module formed of a flexible printed circuit board whose back face is mostly covered with a ground pattern and is partially provided with electric terminals performing input/output of electric signals, and whose top face is provided with electronic components mounted thereon. The radio frequency module is so configured, by folding at least part of the flexible printed circuit board into the shape of a cylinder or a box, as to have a shield enclosure having, as an inner wall thereof, the top face of the flexible printed circuit board including the region where the electronic components are mounted, and, as an outer wall thereof, the back face of the flexible printed circuit board.

In the radio frequency module described above, the individual electric terminals are disposed over two or more outer wall surfaces of the shield enclosure formed by folding the flexible printed circuit board.

In the radio frequency module described above, a folding state of the flexible printed circuit board is fixed with a resin material.

In the radio frequency module described above, the resin material is applied to the top face of the flexible printed circuit board that serves as the inner wall of the module shield structure.

In the radio frequency module described above, at least part of the flexible printed circuit board is a multilayer circuit board having wiring patterns on the top face thereof and in the inner layers thereof other than the back face thereof.

In the radio frequency module described above, the bent portion of the flexible printed circuit board is composed of a smaller number of conductor layers and thus thinner than the other portion.

In the radio frequency module described above, the electronic components mounted on the mutually facing inner wall surfaces of the shield enclosure formed by folding the flexible printed circuit board are so arranged that at least part thereof are not brought into contact with each other.

In the radio frequency module described above, after the flexible printed circuit board is folded into the enclosure, part of the top face of the flexible printed circuit board is exposed to the outside of the enclosure.

In the radio frequency module described above, at least part of the flexible printed circuit board exposed to the outside has, on the back face thereof, no ground conductor, and has an antenna element disposed on the top face thereof.

In the radio frequency module described above, the antenna element is formed as a conductor pattern printed on the top face of the flexible printed circuit board.

In the radio frequency module described above, a plurality of shield enclosures are formed of a single flexible printed circuit board.

In the method of manufacturing the radio frequency module, electronic components are mounted all together on a flexible printed circuit board that is a single sheet circuit board on which the circuits of a plurality of modules are formed. Then, the flexible printed circuit board is folded into a predetermined shape and fixed, and then divided into individual modules.

In the method of manufacturing the radio frequency module, electronic components are mounted all together on a flexible printed circuit board that is a single sheet circuit board on which the circuits of a plurality of shield enclosures included in at least one module are formed. Then, the flexible printed circuit board is folded into a predetermined shape and fixed, and then divided into individual modules.

In the manufacturing method described above, a resin (for example, a thermosetting resin or thermoplastic resin) is applied to the top face of the flexible printed circuit board, before folding it into a module, on which the electronic components are mounted. Then, the predetermined portions of the flexible printed circuit board are bent, and then, while they are temporarily fixed with a temporary fixing jig, the resin is hardened.

Many modifications and variations are possible in light of the above teachings. It is therefore to be understood that within the scope of the appended claims, the invention may be practiced other than as specifically described.

What is claimed is:

1. A radio frequency module comprising:
    electronic components mounted on a top face of a flexible printed circuit board;
    a shield enclosure arranged to electromagnetically shield at least a part of the electronic components from outside, and
    wherein the shield enclosure is formed by folding the flexible printed circuit board in such a way that the electronic components mounted thereon are housed inside the shield enclosure;
    wherein a ground conductor pattern is formed on part of a back face of the flexible printed circuit board;
    wherein the radio frequency module further comprises external signal input/output terminals formed in a region of the back face of the flexible printed circuit board where no ground conductor pattern is formed; and
    wherein the external signal input/output terminals are formed over two or more faces of the shield enclosure.

2. The radio frequency module according to claim 1, wherein the electronic components include an LSI chip, and
    wherein the external signal input/output terminals are arranged in a matrix on the back face of the flexible printed circuit board.

3. The radio frequency module according to claim 1, wherein a folding state of the flexible printed circuit board is fixed with a resin.

4. The radio frequency module according to claim 3, wherein the shield enclosure is filled with the resin.

5. The radio frequency module according to claim 1, wherein at least part of the flexible printed circuit board is a multilayer circuit board.

6. The radio frequency module according to claim 1, wherein the flexible printed circuit board includes:
    a multilayer circuit board; and
    a circuit board that is connected to the multilayer circuit board and has a smaller number of layers than that of the multilayer circuit board.

7. The radio frequency module according to claim 1, wherein the electronic components are disposed on two mutually facing inner wall surfaces of the shield enclosure in such a way that higher profile electronic components face lower profile electronic components between the two mutually facing inner wall surfaces.

8. The radio frequency module according to claim 1, wherein the shield enclosure includes a plurality of sub-enclosures formed by folding the single flexible printed circuit board.

9. The radio frequency module according to claim 8, wherein the sub-enclosures are connected together via a second exposed region where part of the single flexible printed circuit board constituting the sub-enclosures is exposed.

10. The radio frequency module of claim 8, wherein the plurality of sub-enclosures are formed by folding the single flexible printed circuit board such that the electronic components housed inside each sub-enclosure are enclosed with six faces.

11. The radio frequency module of claim 10, wherein the plurality of sub-enclosures share a common circuit board lying in a single plane as one face of the six faces.

12. The radio frequency module of claim 8, wherein the plurality of sub-enclosures are located away from each other with a connection therebetween established by a common flexible printed circuit board.

13. The radio frequency module of claim 1, wherein a material for electromagnetically shielding the electronic components housed inside the shield enclosure from the outside is formed on a back face of the flexible printed circuit board constituting the shield enclosure.

14. The radio frequency module of claim 13, wherein the material is formed so as to cover the electronic components housed inside the shield enclosure.

15. The radio frequency module of claim 1, wherein a part of the electronic components are located inside the shield enclosure and remaining electronic components are located outside the shield enclosure.

16. The radio frequency module of claim 1,
    wherein the shield enclosure is formed by folding the single flexible printed circuit board such that the electronic components housed inside the shield enclosure are enclosed with six faces, and
    wherein a material for electromagnetically shielding the electronic components housed inside the shield enclosure from the outside is formed on backs of the six faces so as to cover the electronic components housed inside the shield enclosure.

17. The radio frequency module of claim 16, wherein the material is a ground conductor pattern.

18. The radio frequency module according to claim 1, further comprising:
    a first exposed region that is a region protruding from the shield enclosure where part of the flexible printed circuit board constituting the shield enclosure is exposed.

19. The radio frequency module according to claim 18,
    wherein there is formed, on at least a part of the back face of the flexible printed circuit board constituting the first exposed region, a region where no ground conductor pattern is formed, and
    wherein an antenna element is formed on a top face of the flexible printed circuit board constituting the first exposed region and having no ground conductor pattern on the back face thereof.

20. The radio frequency module according to claim 19, wherein the antenna element is formed by printing a conductor pattern on the top face of the flexible printed circuit board.

21. A radio frequency module, comprising:
    a flexible printed circuit board folded to define one or more enclosures;
    one or more electronic components mounted on a top face of the flexible printed circuit board within the one or more enclosures;
    wherein an electromagnetic shielding material is formed on one side of the flexible printed circuit board such that the electromagnetic shielding material surrounds the one or more enclosures;
    wherein a ground conductor pattern is formed on part of a back face of the flexible printed circuit board;
    wherein the radio frequency module further comprises external signal input/output terminals formed in a region of the back face of the flexible printed circuit board where no ground conductor pattern is formed; and
    wherein the external signal input/output terminals are formed over two or more faces of the shield enclosures.

22. The radio frequency module of claim 21, wherein the one or more enclosures include plural enclosures arranged such that the electronic component(s) enclosed within each enclosure is shielded from electromagnetic radiation from the electronic component(s) of other enclosures.

23. The radio frequency module of claim 21, further comprising an epoxy resin filled in the one or more enclosures so as to fix the folding state of the one or more enclosures.

24. The radio frequency module of claim 21,
    wherein the flexible printed circuit board includes a first circuit board portion and a second circuit board portion, wherein a number of layers of the first circuit board portion is greater than a number of layers of the second circuit board portion, and wherein the one or more electronic components are mounted on the first circuit board portion.

25. The radio frequency module of claim 24, wherein flexible printed circuit board is folded in the second circuit board portion to define the one or more enclosures.

26. The radio frequency module of claim 24, wherein the flexible printed circuit board is folded in a manner such that at lease one enclosure includes two mutually facing main wall portions on which the electronic components are mounted, and wherein at least one edge wall portion connecting the two mutually main facing wall portions, wherein the at least one edge wall portion including a two-layer structure, the two-layer structuring being the electromagnetic shielding material and a wiring layer formed respectively on an exterior and interior side of the at least one edge wall portion, and wherein the wiring layer of the at least one edge wall portion is arranged to electrically connect the electronic components of the two mutually facing main wall portions.

27. The radio frequency module of claim 24, wherein the flexible printed circuit board is folded in a manner such that at lease one enclosure includes a single main wall portion on which the electronic components are mounted, and wherein at least one other wall portion of the at lease one enclosure including a single layer structure, the single layer being the electromagnetic shielding material formed on an exterior of the at least one other wall portion.

28. The radio frequency module of claim 21, wherein the flexible printed circuit board includes an exposed region which includes a tip portion which does not have the shielding material formed thereon.

29. The radio frequency module of claim 28, wherein an antenna is formed on the tip portion of the exposed region.

30. The radio frequency module of claim 28, wherein the exposed region further includes a lead portion which on which the shielding materials is formed thereon, the lead portion connecting the tip portion to at least one of the one or more enclosures.

* * * * *